United States Patent
Srinivasan

(10) Patent No.: US 10,642,249 B2
(45) Date of Patent: May 5, 2020

(54) METHOD AND SYSTEM FOR REAL-TIME DAMAGE PREDICTION AND QUANTIFICATION

(71) Applicant: Honeywell International Inc., Morris Plains, NJ (US)

(72) Inventor: Sridhar Srinivasan, Houston, TX (US)

(73) Assignee: Honeywell International Inc., Morris Plains, NJ (US)

(*) Notice: Subject to any disclaimer, the term of this patent is extended or adjusted under 35 U.S.C. 154(b) by 310 days.

(21) Appl. No.: 15/583,784

(22) Filed: May 1, 2017

(65) Prior Publication Data

US 2018/0314232 A1 Nov. 1, 2018

(51) Int. Cl.
| | |
|---|---|
| *G06F 7/60* | (2006.01) |
| *G06F 17/10* | (2006.01) |
| *G05B 19/4065* | (2006.01) |
| *G06N 5/04* | (2006.01) |
| *G06F 17/50* | (2006.01) |

(52) U.S. Cl.
CPC ............ *G05B 19/4065* (2013.01); *G05B 2219/42155* (2013.01); *G06F 17/50* (2013.01); *G06N 5/045* (2013.01)

(58) Field of Classification Search
CPC ...... G05B 19/4065; G05B 2219/42155; G05B 23/024; G05B 23/0289; G06N 5/022; G06N 5/045; G06F 17/50
USPC .......................................................... 703/2
See application file for complete search history.

(56) References Cited

PUBLICATIONS

Lagad, Vishal et al., "Advanced ICDA: A Methodology for Quantifying and Mitigating Potential for Corrosion Damage in Pipelines", 2005, Corrosion 2005, NACE International. (Year: 2005).*
Fan, Chenliang et al., "Evaluation of Electrical Resistance Probes to Detect Pipeline Erosion and Sand Production in Low Liquid Loading Flow Conditions", Aug. 17-19, 2011, SPE Eastern Regional Meeting, Society of Petroleum Engineers. (Year: 2011).*
Ryder, Jeremy et al., "Advanced Internal Corrosion Direct Assessment Methodology for Wet Gas/Dry Gas Pipelines", 2014, NACE International. (Year: 2014).*
Morison, W.D. et al., "Solving Common Corrosion Problems with Non-Intrusive Fiber Optic Corrosion and Process Monitoring Sensors", Nov. 27-30, 2005, 3rd MENDT—Middle East Nondestructive Testing Conference & Exhibition. (Year: 2005).*

(Continued)

*Primary Examiner* — Cedric Johnson

(57) ABSTRACT

A method for real-time damage prediction includes obtaining a damage prediction model that mathematically models expected damage to equipment in an industrial process based on a plurality of process parameters. The method also includes obtaining real-time state information for at least one of the plurality of process parameters. The method further includes determining, based on the real-time state information and the damage prediction model, a real-time prediction of damage to at least one component of the equipment in the industrial process. The method may also include obtaining historical data for the plurality of process parameters, and the real-time prediction of damage can be based on the historical data, the real-time state information, and the damage prediction model. The method may further include identifying and adjusting a high limit and a low limit for the at least one of the plurality of process parameters.

20 Claims, 4 Drawing Sheets

(56) References Cited

PUBLICATIONS

Ai, Chansheng et al., "Pipeline Damage and Leak Detection Based on Sound Spectrum LPCC and HMM", 2006, Proceedings of the Sixth International Conference on Intelligent Systems Design and Applications (ISDA '06), IEEE. (Year: 2006).*
Sarkar, S et al. "Statistical Estimation of Multiple Faults in Aircraft Gas Turbine Engines", Feb. 26, 2009, Proc. IMechE vol. 223 Part G: J. Aerospace Engineering. (Year: 2009).*
"SmartCET Corrosion Monitoring Transmitter Model CET5500M—Specification and Model Selection Guide", Honeywell Process Solutions, 34-SC-03-04, Feb. 2010, 10 pages.
U.S. Appl. No. 15/583,728 entitled "Method and System for Predicting Damage of Potential Input to Industrial Process" filed May 1, 2017, 32 pages.

\* cited by examiner

METHOD AND SYSTEM FOR REAL-TIME DAMAGE PREDICTION AND QUANTIFICATION

TECHNICAL FIELD

This disclosure relates generally to industrial process control and automation systems. More specifically, this disclosure relates to a method and system for real-time damage prediction.

BACKGROUND

Industrial processes often cause "wear and tear" on processing equipment in industrial facilities, which may be referred to as damage or corrosion. Damage monitoring is often performed manually by taking the processing equipment offline and inspecting components of the processing equipment. The inspection determines whether components of the processing equipment have been damaged and how much damage has occurred. While offline monitoring processes allow for periodic evaluation of damage, they interrupt the regular operations of the industrial facilities and do not give real-time insight into amounts of damage and causes of damage.

SUMMARY

This disclosure provides a method and system for real-time damage prediction and quantification.

In a first embodiment, a method for real-time damage prediction includes obtaining a damage prediction model that mathematically models expected damage to equipment in an industrial process based on a plurality of process parameters. The method also includes obtaining real-time state information for at least one of the plurality of process parameters. The method further includes determining, based on the real-time state information and the damage prediction model, a real-time prediction of damage to at least one component of the equipment in the industrial process.

In a second embodiment, an apparatus for real-time damage prediction includes at least one memory configured to store a damage prediction model that mathematically models expected damage to equipment in an industrial process based on a plurality of process parameters. The apparatus also includes at least one processing device configured to obtain real-time state information for at least one of the plurality of process parameters and determine, based on the real-time state information and the damage prediction model, a real-time prediction of damage to at least one component of the equipment in the industrial process.

In a third embodiment, a non-transitory computer readable medium contains computer readable program code that when executed causes at least one processing device to obtain a damage prediction model that mathematically models expected damage to equipment in an industrial process based on a plurality of process parameters. The medium also contains computer readable program code that when executed causes the at least one processing device to obtain real-time state information for at least one of the plurality of process parameters. The medium further contains computer readable program code that when executed causes the at least one processing device to determine, based on the real-time state information and the damage prediction model, a real-time prediction of damage to at least one component of the equipment in the industrial process.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

As noted above, industrial processes often cause "wear and tear" on processing equipment in industrial facilities. Tracking this wear and tear, which may also be referred to as damage or corrosion, can be useful or important in preventing dangerous or costly failures in industrial facilities. Facility operators typically track the damage to equipment components over time based on periodic inspections of the components and predict how much longer the components can safely function before being replaced. Unfortunately, this approach typically requires that process equipment be taken offline for inspection, which interrupts the regular operations of the industrial facility. Moreover, this approach does not provide real-time insight into amounts of damage and causes of damage since the components are inspected periodically.

This disclosure provides techniques for real-time damage prediction that allows, among other things, equipment owners or operators to identify real-time predictions of the amount of damage to their equipment. For example, these techniques can be used to identify a rate of damage by use of a prediction model, which can be used to determine a rate of damage based on knowledge of the real-time state of various process parameters (such as temperature, pressure, and flow rate). Once the model is used to generate a real-time prediction of a rate of damage, the prediction can be presented to the owner or operator as another process parameter, and the owner or operator may use the real-time prediction to determine whether to modify an industrial process.

These techniques can therefore be used to more accurately predict a rate of damage of a given component in order to allow the owner or operator to adjust the industrial process in order to reduce the rate of damage. This helps to increase the operational lifetime of the components while reducing the risk of injury and unnecessary repair expenses. Moreover, real-time prediction of the rate of damage allows the owner or operator to modify an industrial process more quickly, which can again reduce the rate of damage, increase the operational lifetime of the components, and reduce the risk of a dangerous and costly failure.

Figure 1:
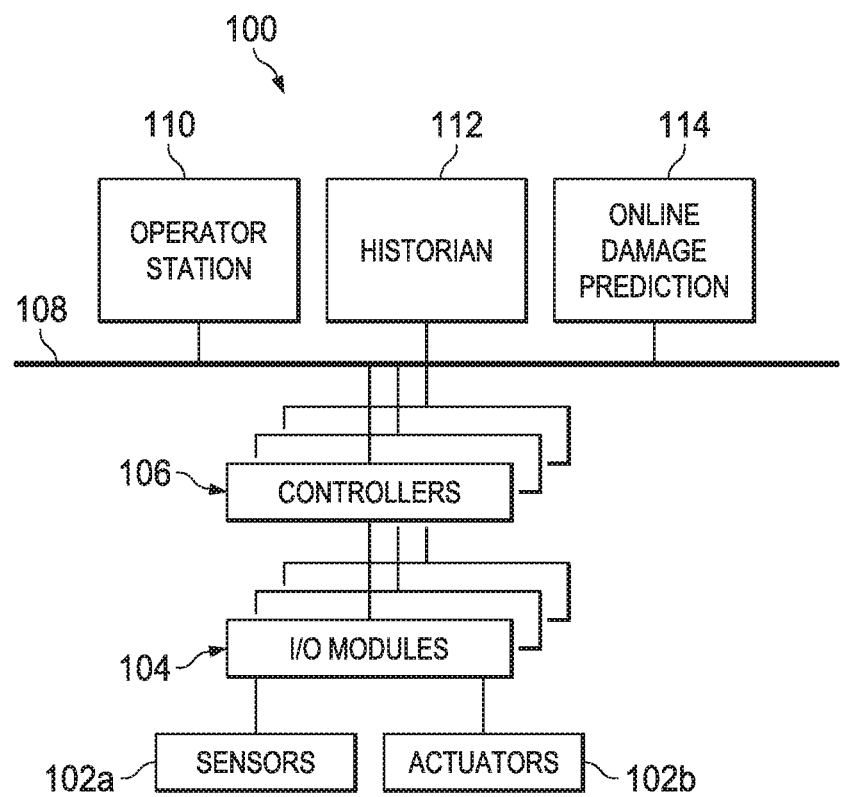
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 can be used to facilitate control or monitoring of components in one or multiple industrial plants. Each plant represents one or more processing facilities (or one or more portions thereof), such as one or more manufacturing facilities for producing at least one product or other material. In general, each plant may implement one or more industrial processes and can individually or collectively be referred to as a process system. A process system generally represents any system or portion thereof configured to process one or more products or other materials in some manner.

In the example shown in FIG. 1, the system 100 includes one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. Each of the sensors 102a includes any suitable structure for measuring one or more characteristics in a process system. Each of the actuators 102b includes any suitable structure for operating on or affecting one or more conditions in a process system.

At least one input/output (I/O) module 104 is coupled to the sensors 102a and actuators 102b. The I/O modules 104 facilitate interaction with the sensors 102a, actuators 102b, or other field devices. For example, an I/O module 104 could be used to receive one or more analog inputs (AIs), digital inputs (DIs), digital input sequences of events (DISOEs), or pulse accumulator inputs (PIs) or to provide one or more analog outputs (AOs) or digital outputs (DOs). Each I/O module 104 includes any suitable structure(s) for receiving one or more input signals from or providing one or more output signals to one or more field devices. Depending on the implementation, an I/O module 104 could include fixed number(s) and type(s) of inputs or outputs or reconfigurable inputs or outputs.

The system 100 also includes various controllers 106. The controllers 106 can be used in the system 100 to perform various functions in order to control one or more industrial processes. For example, a first set of controllers 106 may use measurements from one or more sensors 102a to control the operation of one or more actuators 102b. These controllers 106 could interact with the sensors 102a, actuators 102b, and other field devices via the I/O module(s) 104. A second set of controllers 106 could be used to optimize the control logic or other operations performed by the first set of controllers. A third set of controllers 106 could be used to perform additional functions.

Controllers 106 are often arranged hierarchically in a system. For example, different controllers 106 could be used to control individual actuators, collections of actuators forming machines, collections of machines forming units, collections of units forming plants, and collections of plants forming an enterprise. A particular example of a hierarchical arrangement of controllers 106 is defined as the "Purdue" model of process control. The controllers 106 in different hierarchical levels can communicate via one or more networks 108 and associated switches, firewalls, and other components.

Each controller 106 includes any suitable structure for controlling one or more aspects of an industrial process. At least some of the controllers 106 could, for example, represent proportional-integral-derivative (PID) controllers or multivariable controllers, such as Robust Multivariable Predictive Control Technology (RMPCT) controllers or other types of controllers implementing model predictive control (MPC) or other advanced predictive control. As a particular example, each controller 106 could represent a computing device running a real-time operating system, a MICROSOFT WINDOWS operating system, or other operating system.

Operator access to and interaction with the controllers 106 and other components of the system 100 can occur via various operator stations 110. Each operator station 110 could be used to provide information to an operator and receive information from an operator. For example, each operator station 110 could provide information identifying a current state of an industrial process to an operator, such as values of various process variables and warnings, alarms, real-time predicted damage rates, or other states associated with an industrial process. Each operator station 110 could also receive information affecting how the industrial process is controlled, such as by receiving setpoints for process variables controlled by the controllers 106 or other information that alters or affects how the controllers 106 control the industrial process. Each operator station 110 includes any suitable structure for displaying information to and interacting with an operator, such as a computing device running a MICROSOFT WINDOWS operating system or other operating system.

A process data historian 112 is coupled to the network 108 in this example. The historian 112 could represent a component that stores various information about the system 100. The historian 112 could, for example, store information used during process control, production scheduling, and optimization. The historian 112 represents any suitable structure for storing and facilitating retrieval of information. Although shown as a single centralized component coupled to the network 108, the historian 112 could be located elsewhere in the system 100, or multiple historians could be distributed in different locations in the system 100. Moreover, in other embodiments, one or more historians 112 may be external to and communicatively coupled to the system 100.

The system 100 also includes an online damage prediction system 114, which is coupled to the network 108 in this example. The prediction system 114 communicates with the historian 112 and other components of the system 100, such as via the network 108, in order to receive data related to operation of the system 100 and the underlying industrial process(es). Based on that data, the prediction system 114 generates one or more predictions of damage to process equipment implementing the underlying industrial process(es). For example, the prediction system 114 could generate predicted rates of damage and identify predicted failures of process equipment based on those rates.

The prediction system 114 could then use that information in any suitable manner. For instance, the prediction system 114 could communicate predicted damage information to the operator stations 110 for use with other process parameters in determining whether to adjust the underlying industrial process(es). As a particular example, human operators or automated tools could use the predicted damage rates to vary setpoints for process variables in order to alter the underlying industrial process(es) and ideally reduce the damage rates.

Additional details regarding the operations of the prediction system 114 are provided below. The prediction system 114 could be implemented in any suitable manner. For example, the prediction system 114 could be implemented using software or firmware instructions that are executed by one or more processors of a computing device, such as a desktop, laptop, server, or tablet computer. The prediction system 114 could also be implemented in other parts of the system 100 and need not represent a stand-alone component, such as when executed by one or more of the operators stations 110 or controllers 106. The prediction system 114 could further be implemented outside of the system 100, such as in remote server, a cloud-based environment, or any other computing system or environment communicatively coupled to the system 100. Note, however, that the prediction system 114 could be implemented in any other suitable manner.

Although FIG. 1 illustrates one example of an industrial process control and automation system 100, various changes may be made to FIG. 1. For example, various components in FIG. 1 could be combined, further subdivided, rearranged, or omitted and additional components could be added according to particular needs. Also, industrial control and automation systems come in a wide variety of configurations. The system 100 shown in FIG. 1 is meant to illustrate one example operational environment in which damage prediction may be used or supported. However, FIG. 1 does not limit this disclosure to any particular configuration or operational environment. In addition, FIG. 1 represents a brief description of one type of industrial process control and automation system that may be used to manufacture or process one or more materials. Additional details regarding industrial process control and automation systems are well-known in the art and are not needed for an understanding of this disclosure.

Figure 2:
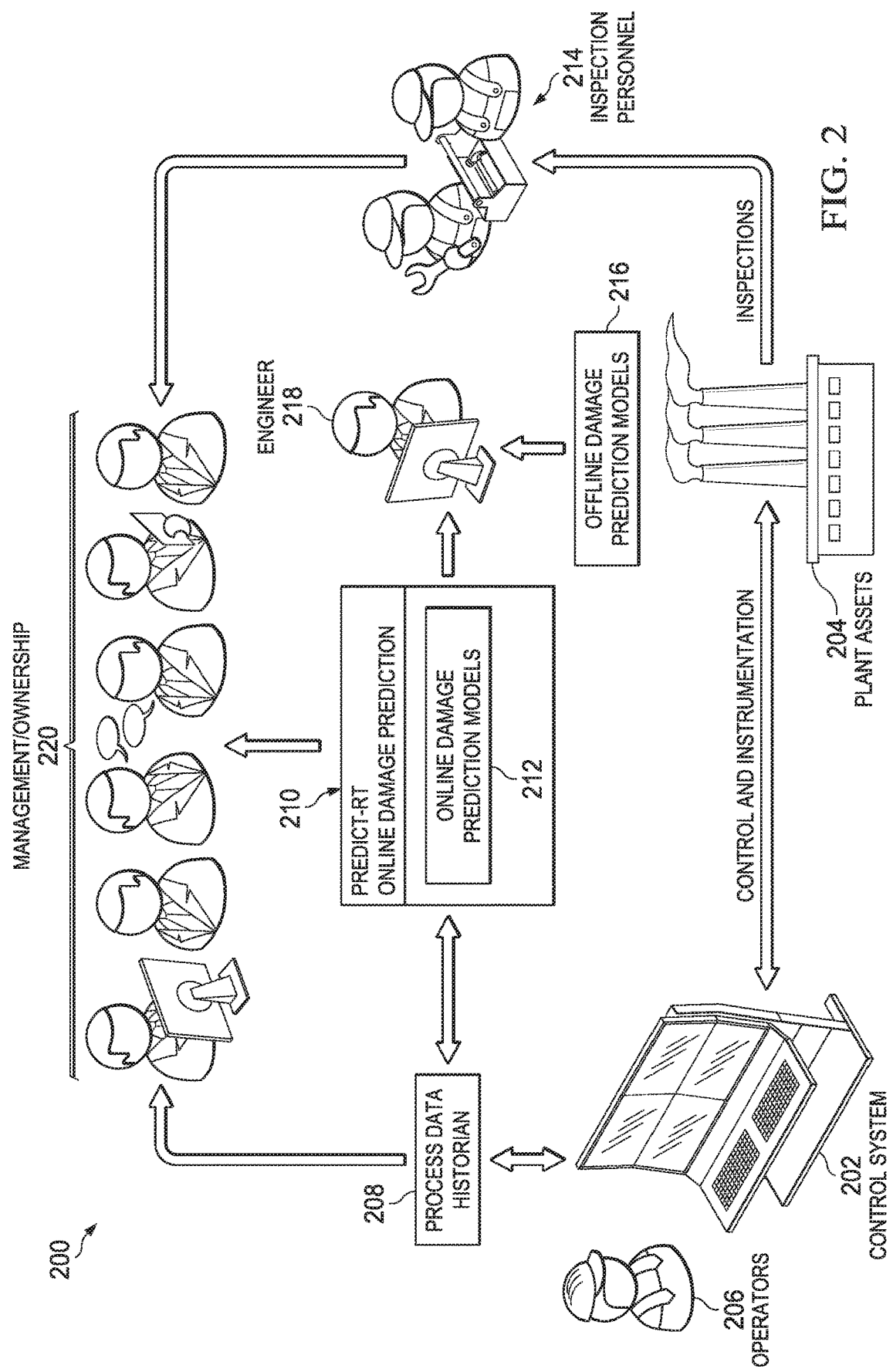
FIG. 2 illustrates an example real-time damage prediction system according to this disclosure.

FIG. 2 illustrates an example real-time damage prediction system 200 according to this disclosure. The prediction system 200 could, for example, be implemented within or in conjunction with the online damage prediction system 114 of FIG. 1. Note, however, that the prediction system 200 could be used in any other suitable control and automation system.

As shown in FIG. 2, the system 200 includes at least one industrial process control system 202 and various plant assets 204. The plant assets 204 denote the physical process equipment that implement one or more industrial processes, such as equipment used to manufacture chemical, pharmaceutical, paper, or petrochemical products. The control system 202 includes the components in a control and automation system that manage and control the plant assets 204. The control system 202 could, for example, include part or all of the system 100 shown in FIG. 1.

Various operators 206 use the control system 202 to control the processes implemented by the plant assets 204. For example, operator consoles 110 in the control system 202 could provide process data to one or more of the operators 206. The process data may include data identifying the present state of various process parameters such as temperature, pressure, flow rate, damage rate, or the like. Based on the process parameters, the operators 206 may use the control system 202 to alter process parameters to achieve a desired result, such as by reducing a flow rate of material to lower a predicted damage rate. In some embodiments, the control system 202 provides operators 206 with suggested courses of action to achieve desired results as described in more detail below.

The system 200 here also includes a process data historian 208, which could denote the historian 112 shown in FIG. 1. As noted above, however, the historian 208 could reside within the control system 202.

An online damage prediction system 210 implements the prediction system 114 shown in FIG. 1. In this example, the online damage prediction system 210 contains at least one online damage prediction model 212. The model 212 mathematically represents how damage occurs over time given changes in process data values. The prediction system 210 receives process data values in real-time, such as from the historian 208 or from components of the control system 202. The prediction system 210 uses these process data values and the model(s) 212 to predict how damage is predicted to occur in the plant assets 204 as a result of the process data values. For instance, the prediction system 210 can use the process data values to quantify damage rates and predict levels of future damage.

In some embodiments, the prediction system 210 can communicate with both the historian 208 and the control system 202 in order to import both historical and real-time values of these process variables in real-time. The prediction system 210 uses the imported process data values in conjunction with the prediction model 212 to determine real-time predicted damage rates for one or more of the plant assets 204. Thus, the prediction system 210 can identify predicted damage to plant assets 204 in real-time as process data values change. This provides operators with more accurate estimates of damage to the plant assets 204.

The prediction system 210 can communicate the real-time predicted damage rates or other calculated data to the historian 208 for storage and to the control system 202. The historian 208 could log the data from the prediction system 210 over time. The control system 202 could use the data in any suitable manner, such as by displaying the damage rates to the operators 206 for observation in real-time.

In some embodiments, plant assets 204 are also periodically inspected offline by inspection personnel 214. For example, components of the plant assets 204 can be weighed to determine an amount of material that has been removed via corrosion. The inspection data can be used to generate one or more offline damage prediction models 216, which represent the actual damage that occurred to the plant assets 204 over time. Data from the historian 208 could also be used to generate the prediction models 216. In this way, the prediction models 216 can be used to mathematically represent actual damage and can be updated periodically, such as each time that an inspection is performed. One or more engineers or other personnel 218 can review the actual damage data and the predicted damage from both the offline and online prediction models. The personnel 218 may use this comparison to update the prediction models 212 or to alter the designs of various plant assets 204.

Management personnel 220 may additionally be able to monitor the data recorded in the historian 208 and receive damage predictions from the prediction system 210. The management personnel 220 may also receive inspection reports from the inspection personnel 214 and the offline damage predictions based on the offline prediction models 216. Based on this information, the management personnel 220 may modify operational policies to reduce damage rates, obtain replacements for plant assets 204, or the like.

Although FIG. 2 illustrates one example of a real-time damage prediction system 200, various changes may be made to FIG. 2. For example, various components in FIG. 2 could be combined, further subdivided, rearranged, or omitted and additional components could be added according to particular needs. As a specific example, various components in FIG. 2 could be integrated into the control system 202.

Figure 3:
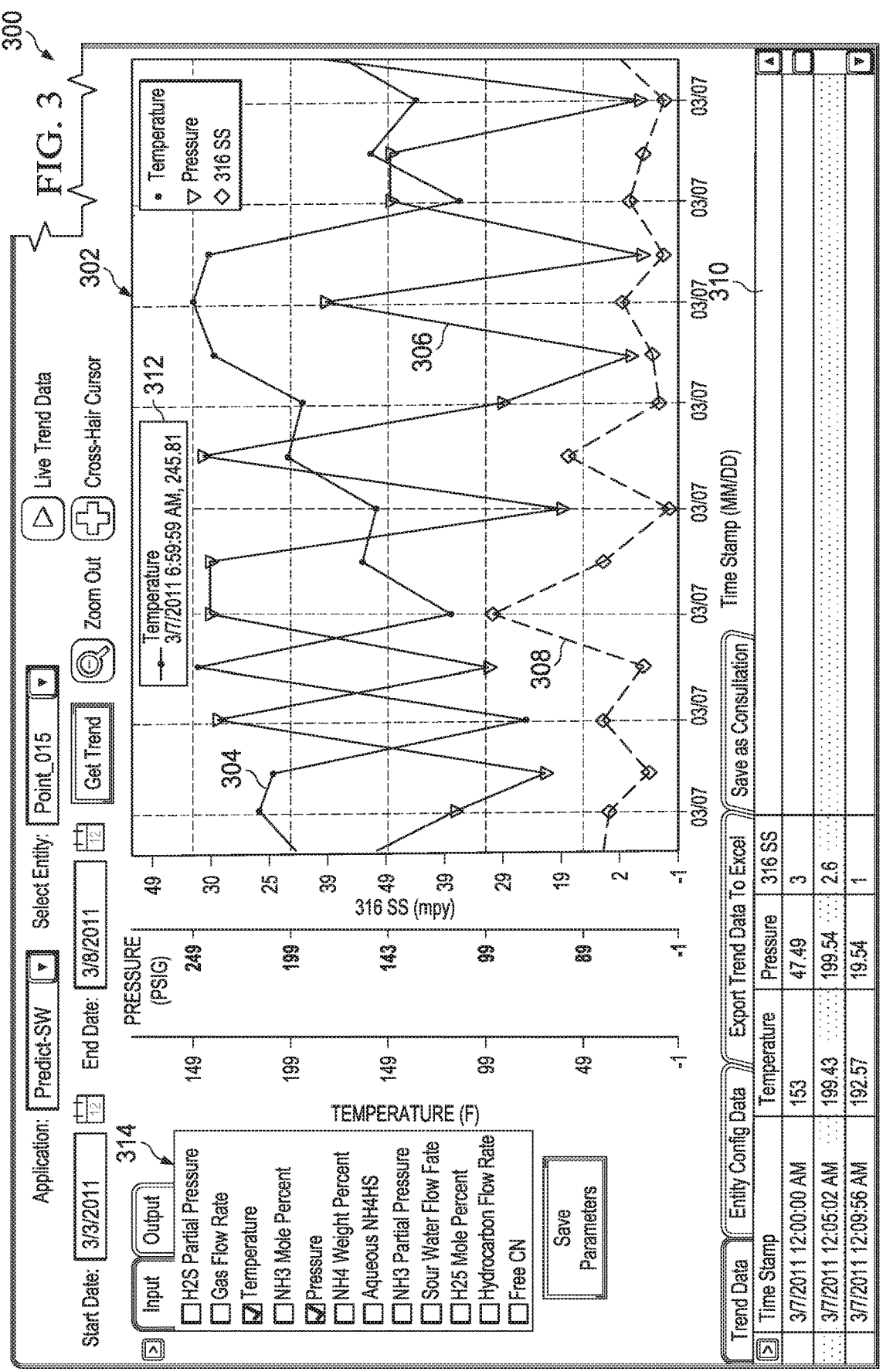
FIG. 3 illustrates an example graphical user interface (GUI) for displaying real-time damage predictions according to this disclosure.

FIG. 3 illustrates an example graphical user interface (GUI) 300 for displaying real-time damage predictions according to this disclosure. The GUI 300 could be used, for example, to display real-time damage predictions generated by the online damage prediction system 114 of FIG. 1 or the prediction system 210 of FIG. 2. The GUI 300 could also be displayed on a display device, such as on an operator station 110 of FIG. 1, and could be generated by software running on that device. Note, however, that the GUI 300 could be displayed on any other suitable display device and could be implemented using any other suitable computing device.

As shown in FIG. 3, the GUI 300 displays a graph 302 that presents a real-time state of various process parameters for a particular process and a particular plant asset 204. In this example, a line 304 represents the real-time state of a temperature associated with the plant asset 204, and a line 306 represents the real-time state of a pressure associated with the plant asset 204. The graph 302 additionally contains a line 308 representing the real-time prediction of damage to the plant asset due to the process. In a specific embodiment, the line 308 represents the real-time prediction of damage of stainless steel forming a pipe through which a mixture flows at the temperature and pressure indicated by the lines 304 and 306, respectively. In this way, the real-time damage prediction may be viewed as a virtual process parameter of the process control and automation system 100. Each line 304, 306, and 308 represents a series of values of the respective process parameter. In some embodiments, a timestamp is displayed on the graph, such as on the X-axis of the graph, for each sample of process parameters that is taken.

A numerical parameter display window 310 shows values of various process parameters in numerical form as an alternative to the graph 302. The information displayed in the window 310 may be more detailed than the information displayed in the graph 302 for the corresponding process parameter. Accordingly, the window 310 may be useful for obtaining detailed information about the state of a given process parameter after getting a general idea of the state of the parameter from the graph 302. In this example embodiment, the numerical parameter display window 310 is in the form of a table that lists the real-time state of process parameters for the three most recent samples. Of course, the window 310 could display more or fewer values, such as by increasing the number of data points displayed or by changing the timestamps that are displayed in the window 310.

In some embodiments, the information displayed in the window 310 may also be available in the graph 302. For example, a user may be able to manipulate a cursor to select any desired point on a line 304, 306, or 308 of the graph 302 to view the detailed information associated with that point in time in the window 312. The user may also be able to cause the window 310 to display information for one or more points on a line 304, 306, or 308 of the graph 302 by selecting a point on the graph 302 in the same manner.

A parameter selection window 314 allows a user to select which process parameters are displayed in the graph 302 and the numerical parameter display window 310. In this example, temperature and pressure are selected, resulting in the display of the lines 304 and 306, respectively. Process parameters displayed for selection in the window 314 may include both input parameters and output parameters for the process and the plant asset, such as the temperature of a mixture that is input to a piece of piping and the temperature of the mixture that is output from the piece of piping. In some embodiments, a real-time prediction of damage may be listed as a process parameter that can be selected or de-selected for display in the graph 302. The window 314 may allow selection of input parameters, output parameters, or any combination of these or other parameters.

Although FIG. 3 illustrates one example of a GUI 300 for displaying real-time damage predictions, various changes may be made to FIG. 3. For example, the content, layout, and arrangement of the GUI 300 is for illustration only, and various changes may be made to the GUI 300 as needed or desired. As a specific example, the numerical parameter display window 310 could be omitted, or the data available in the window 310 could be made available by manipulating a cursor to select one or more points on lines 304, 306, or 308 of the graph 302.

Figure 4:
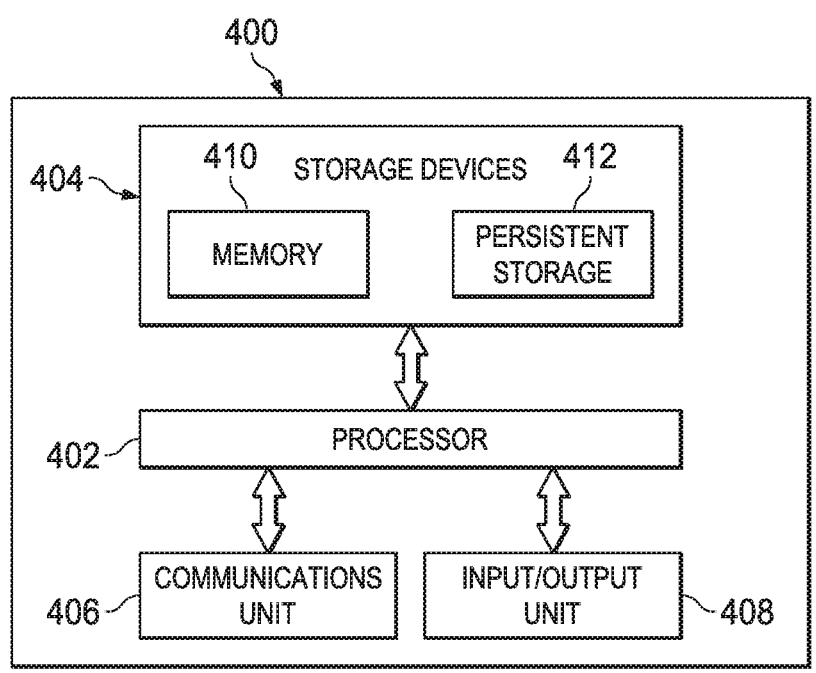
FIG. 4 illustrates an example device for real-time damage prediction according to this disclosure.

FIG. 4 illustrates an example device 400 for real-time damage prediction according to this disclosure. The device 400 could, for example, denote a computing device that executes the prediction system 114 or the prediction system 210. Note, however, that each prediction system could be implemented using any other suitable device.

As shown in FIG. 4, the device 400 includes at least one processor 402, at least one storage device 404, at least one communications unit 406, and at least one input/output (I/O) unit 408. Each processor 402 can execute instructions, such as those that may be loaded into a memory 410. Each processor 402 denotes any suitable processing device, such as one or more microprocessors, microcontrollers, digital signal processors, application specific integrated circuits (ASICs), field programmable gate arrays (FPGAs), or discrete circuitry.

The memory 410 and a persistent storage 412 are examples of storage devices 404, which represent any structure(s) capable of storing and facilitating retrieval of information (such as data, program code, and/or other suitable information on a temporary or permanent basis). The memory 410 may represent a random access memory, a buffer or cache, or any other suitable volatile or non-volatile storage device(s). The persistent storage 412 may contain one or more components or devices supporting longer-term storage of data, such as a read only memory, hard drive, Flash memory, or optical disc.

The communications unit 406 supports communications with other systems or devices. For example, the communications unit 406 could include at least one network interface card or wireless transceiver facilitating communications over at least one wired or wireless network, such as the network 208. The communications unit 406 may support communications through any suitable physical or wireless communication link(s).

The I/O unit 408 allows for input and output of data. For example, the I/O unit 408 may allow the device 400 to perform process I/O similar to, or in place of, I/O modules 204, as described above. In other embodiments, the I/O unit 408 may provide a connection for user input through a keyboard, mouse, keypad, touchscreen, or other suitable input device. The I/O unit 408 may also send output to a display, printer, or other suitable output device. The user input and output devices for controllers that interface with an operator may, for example, be included in the operator station 210.

Although FIG. 4 illustrates one example of a device 400 for real-time damage prediction, various changes may be made to FIG. 4. For example, various components in FIG. 4 could be combined, further subdivided, rearranged, or omitted and additional components could be added according to particular needs. Also, computing devices come in a wide variety of configurations, and FIG. 4 does not limit this disclosure to any particular configuration of computing device.

Figure 5:
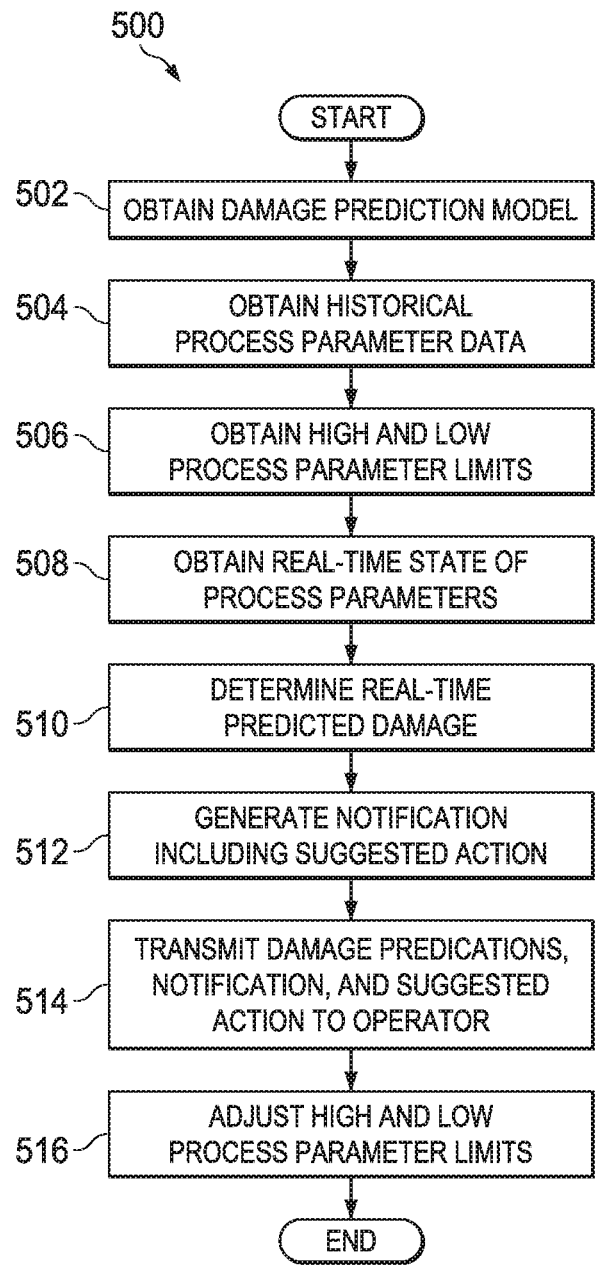
FIG. 5 illustrates an example method for real-time damage prediction according to this disclosure.

FIG. 5 illustrates an example method 500 for real-time damage prediction according to this disclosure. For ease of explanation, the method 500 is described with respect to the system 100 of FIG. 1 or the system 200 of FIG. 2, although the method 500 could be implemented in any other suitable system. Also, for ease of explanation, the method 500 is described as being executed by the device 400 of FIG. 4, although any other suitable device could be used to implement the method 500.

At step 502, a damage prediction model is obtained. This could include, for example, the prediction system 114 or 210 obtaining one or more online damage prediction models 212. In some embodiments, different prediction models 212 may be associated with different damage mechanisms, such as sour water damage, amine damage, crude oil damage, sulfuric acid alkylation, component cracking, or the like. Also, in some embodiments, a prediction model 212 could denote a plant-wide model that includes separate damage prediction models for each specific component of a plant, and in such a case the method 500 could be performed for each specific component using its corresponding damage prediction model. Each prediction model 212 could be generated in any suitable manner, such as based on actual damage detected during physical inspections of plant assets 204 over time.

At step 504, historical process parameter data is obtained. This could include, for example, the prediction system 114 or 210 obtaining historical process parameter data from a historian 112 or 208. The historical process parameter data may be recorded in the historian and accessed by the prediction system as needed. The process parameters may include any suitable parameters related to an industrial process, such as chemical mixture ratios, temperature, pressure, flow rate, vibration, or the like. In some embodiments, the historical process parameter data also includes data collected from offline inspections.

At step 506, high and low limits for one or more process parameters of a component of a plant are obtained. This could include, for example, the prediction system 114 or 210 retrieving or generating the high and low limits based on a prediction model 212, the historical process parameter data, safety standards, offline inspection data, or the like. In some embodiments, multiple high and low limits are generated, such as critical high and low limits, standard high and low limits, and target high and low limits. Also, in some embodiments, the high and low limits for the one or more process parameters may correspond to a particular underlying process variable, such as pressure or temperature, that is responsible for the damage to the component. The high and low limits may further correspond to a particular damage mechanism, such as sour water damage or other damage mechanisms identified above.

At step 508, real-time state data is obtained for one or more of the process parameters. This could include, for example, the prediction system 114 or 210 obtaining data from the sensors 102a that sense the real-time state of temperature, pressure, flow rate, or other process parameters.

At step 510, real-time predicted damage is determined for one or more plant components. This could include, for example, the prediction system 114 or 210 determining predicted damage rates for one or more plant assets 204 based on the damage prediction model 212 by applying the real-time process parameter state data to the model 212, along with any historical process parameter data received earlier. In some embodiments, only the real-time process parameter state data may be used to determine real-time predicted damage rates. In particular embodiments, the real-time predicted damage rate may be expressed as a rate of material damage of a component, such as in terms of millimeters of material corroded per year.

At step 512, a notification of the real-time predicted damage along with a suggested action based on the real-time predicted damage is generated. This could include, for example, the prediction system 114 or 210 generating the notification and the suggested action based on a comparison between the predicted real-time damage rate and the high and low limits established earlier. If the predicted real-time damage rate is within the limits, no notification may be generated, or a notification indicating that operation is normal may be generated. In such a case, no suggested action may be generated, or a suggestion to continue operation may be generated. If the predicted real-time damage rate is above the high limit or below the low limit, a notification that the predicted real-time damage rate is too high or too low may be generated. In such a case, various suggested actions may be generated, such as a suggestion to adjust an input to an industrial process that will reduce or increase a process parameter. The suggested action may be determined based on the real-time damage prediction model as an action that will reduce or increase the predicted real-time damage rate. In embodiments with multiple sets of high and low limits, different notifications may be generated upon violating different limits.

At step 514, the predicted real-time damage and any notifications or suggested actions are transmitted to one or more operators. This could include, for example, the prediction system 114 or 210 transmitting the data to an operator station 110 for display to one or more operators 206. The prediction system 114 or 210 could also transmit the data to the management personnel 220, engineers 218, or any other appropriate personnel that could use this information. In some embodiments, the transmitted data is also stored in a process data historian. In this way, the predicted real-time damage functions as another process variable in the system, allowing operators, engineers, or other personnel to make decisions about modifying industrial processes in real-time to reduce potential damage.

At step 516, the high and low limits may be adjusted. This could include, for example, the prediction system 114 or 210 receiving new high and low limits from an operator, such as via an operator station 110. This could also include the prediction system 114 or 210 determining that, based on actual inspection data, that changes to the limits are needed.

Note that the method 500 or portions of the method 500 could be repeated any number of times and at any suitable intervals to provide damage prediction for one or multiple plant assets 204. In this way, owners and operators of industrial control and automation systems can more accurately gauge damage to their systems and take suitable corrective actions.

Although FIG. 5 illustrates one example of a method 500 for real-time damage prediction, various changes may be made to FIG. 5. For example, while shown as a series of steps, various steps in FIG. 5 could overlap, occur in parallel, occur in a different order, or occur any number of times.

The following provides details of a specific implementation of the described damage prediction approach for a refinery. The following details relate to this specific implementation and may not limit other approaches.

In one example implementation, an online damage prediction model 212 is used to associate real-time measurements of ammonium bisulfide ($NH_4HS$) concentration (wt %) in a process stream at a given plant asset. An error in underestimating the ammonium bisulfide concentration can lead to significant underestimation of the damage rate. For example, an increase of ammonium bisulfide from 5 wt % to 10 wt % (which is a standard variance in most operating windows) can lead to an increase in corrosion of stainless steel in excess of 300%. Accordingly, accurate real-time updating of the ammonium bisulfide concentration allows the model 212 to be used to predict damage in real-time, allowing an owner or operator to see large changes in damage rates caused by small changes in ammonium bisulfide concentration and to take appropriate action to remediate the issue before any damage or significant damage occurs.

In some embodiments, the online damage prediction model 212 may take into account multiple interlinked process parameters that are sensed in real-time in determining damage rate. For example, hydrocarbon condensate in sour water systems may be beneficial, reducing corrosion severity when the hydrocarbon condensate wets the pipe walls. Hydrocarbon condensate in excess of 25 to 40 volume percent (vol %), depending on American Petroleum Institute (API) gravity, results in a marked decrease in system corrosivity. However, protection from hydrocarbon condensates is reduced or eliminated by certain flow regimes (laminar, stratified, or wavy flow regimes) at lower flow rates. These flow regimes allow phase separation, or a likelihood of water wetting the pipe walls instead of the hydrocarbon condensate, even at higher vol % levels of condensate. The model 212 may therefore be used to associate real-time information on the flow rate and flow regime as well as the hydrocarbon condensate vol % levels. The model 212 could then be used to determine a real-time prediction of corrosion based on the interaction between these process parameters. Other examples of interlinked parameters that the model 212 may represent are $H_2S$ partial pressure and $NH_4HS$ wt %, or $NH_3$ partial pressure and relative domination of $NH_3$ and $H_2S$ (whether $NH_3$ or $H_2S$ is dominant in the system).

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for real-time damage prediction in an industrial plant, comprising:
   obtaining a damage prediction model that mathematically models expected damage to equipment in an industrial process based on a plurality of process parameters;
   obtaining real-time state information for at least one of the plurality of process parameters from at least one sensor of a system that facilitates control and monitoring of at least one component of equipment in an industrial process of at least one industrial plant; and
   determining, based on the real-time state information obtained from the at least one sensor and based on the damage prediction model, a real-time prediction of damage to the at least one component of the equipment in the industrial process of the at least one industrial plant; and
   identifying a high limit and a low limit for the at least one of the plurality of process parameters;
   wherein determining the real-time prediction of damage includes determining, based on the real-time state information, whether the at least one of the plurality of process parameters has passed the high limit or the low limit.

2. The method of claim 1, further comprising:
obtaining historical data for the plurality of process parameters;
wherein determining the real-time prediction of damage comprises determining the real-time prediction of damage based on the historical data, the real-time state information, and the damage prediction model.

3. The method of claim 1, further comprising:
determining at least one action for altering the real-time prediction of damage; and
transmitting a notification identifying the at least one action to an operator.

4. The method of claim 1, further comprising:
generating, based on the real-time prediction of damage, at least one notification; and
transmitting the at least one notification to an operator.

5. The method of claim 1, wherein the system further comprises at least one actuator that includes a structure for operating on or affecting at least one condition in the at least one industrial plant and wherein the at least one sensor includes a structure for measuring at least one characteristic in the at least one industrial plant.

6. The method of claim 1, further comprising:
adjusting at least one of the high limit and the low limit for the at least one of the plurality of process parameters.

7. The method of claim 1, further comprising:
storing the real-time prediction of damage in a memory.

8. An apparatus for real-time damage prediction in an industrial plant, comprising:
at least one processor and at least one memory configured to store instructions comprising a damage prediction model that mathematically models expected damage to equipment in an industrial process based on a plurality of process parameters, wherein the instructions cause the at least one processor to perform:
obtaining real-time state information for at least one of the plurality of process parameters from at least one sensor of a system that facilitates control and monitoring of at least one component of equipment in an industrial process of at least one industrial plant;
determining, based on the real-time state information obtained from the at least one sensor and based on the damage prediction model, a real-time prediction of damage to the at least one component of the equipment in the industrial process of the at least one industrial plant; and
identifying a high limit and a low limit for the at least one of the plurality of process parameters;
wherein determining the real-time prediction of damage includes determining, based on the real-time state information, whether the at least one of the plurality of process parameters has passed the high limit or the low limit.

9. The apparatus of claim 8, further comprising:
at least one network interface configured to receive historical data for the plurality of process parameters;
wherein the at least one processor is configured to determine the real-time prediction of damage based on the historical data, the real-time state information, and the damage prediction model.

10. The apparatus of claim 8, wherein the instructions are further configured to cause the at least one processor to perform determining at least one action for altering the real-time prediction of damage; and
further comprising at least one network interface configured to transmit a notification identifying the at least one action to an operator.

11. The apparatus of claim 8, wherein the instructions are further configured to cause the at least one processor to generate, based on the real-time prediction of damage, at least one notification; and
further comprising at least one network interface configured to transmit the at least one notification to an operator.

12. The apparatus of claim 8, wherein the system further comprises at least one actuator that includes a structure for operating on or affecting at least one condition in the at least one industrial plant and wherein the at least one sensor includes a structure for measuring at least one characteristic in the at least one industrial plant.

13. The apparatus of claim 8, wherein the instructions are further configured for causing the at least one processor to adjust the high limit and the low limit for the at least one of the plurality of process parameters.

14. The apparatus of claim 8, wherein the instructions are further configured to cause the at least one processor is further configured to store the real-time prediction of damage in the at least one memory.

15. A non-transitory computer readable medium containing computer readable program code that when executed causes at least one processor to:
obtain a damage prediction model that mathematically models expected damage to equipment in an industrial process based on a plurality of process parameters;
obtain real-time state information for at least one of the plurality of process parameters from at least one sensor of a system that facilitates control and monitoring of at least one component of equipment in an industrial process of at least one industrial plant; and
determine, based on the real-time state information obtained from the at least one sensor and based on the damage prediction model, a real-time prediction of damage to at least one component of the equipment in the industrial process of the at least one industrial plant; and
identifying a high limit and a low limit for the at least one of the plurality of process parameters;
wherein determining the real-time prediction of damage includes determining, based on the real-time state information, whether the at least one of the plurality of process parameters has passed the high limit or the low limit.

16. The non-transitory computer readable medium of claim 15, further containing computer readable program code that when executed causes the at least one processor to obtain historical data for the plurality of process parameters;
wherein the computer readable program code that when executed causes the at least one processor to determine the real-time prediction of damage comprises:
computer readable program code that when executed causes the at least one processor to determine the real-time prediction of damage based on the historical data, the real-time state information, and the damage prediction model.

17. The non-transitory computer readable medium of claim 15, further containing computer readable program code that when executed causes the at least one processor to:
determine at least one action for altering the real-time prediction of damage; and
transmit a notification identifying the at least one action to an operator.

18. The non-transitory computer readable medium of claim 15, further containing computer readable program code that when executed causes the at least one processor to:
generate, based on the real-time prediction of damage, at least one notification; and
transmit the at least one notification to an operator.

19. The non-transitory computer readable medium of claim 15, wherein the system further comprises at least one actuator that includes a structure for operating on or affecting at least one condition in the at least one industrial plant and wherein the at least one sensor includes a structure for measuring at least one characteristic in the at least one industrial plant.

20. The non-transitory computer readable medium of claim 15, further containing computer readable program code that when executed causes the at least one processor to adjust at least one of the high limit and the low limit for the at least one of the plurality of process parameters.

* * * * *